(12) United States Patent
Salman et al.

(10) Patent No.: US 7,982,432 B2
(45) Date of Patent: Jul. 19, 2011

(54) METHOD AND SYSTEM FOR MONITORING AN ELECTRICAL ENERGY STORAGE DEVICE

(75) Inventors: Mutasim A. Salman, Rochester Hills, MI (US); Zhenhui Yao, Warren, MI (US)

(73) Assignee: GM Global Technology Operations, LLC, Detroit, MI (US)

( * ) Notice: Subject to any disclaimer, the term of this patent is extended or adjusted under 35 U.S.C. 154(b) by 540 days.

(21) Appl. No.: 11/853,865

(22) Filed: Sep. 12, 2007

(65) Prior Publication Data

US 2008/0150541 A1 Jun. 26, 2008

Related U.S. Application Data

(60) Provisional application No. 60/871,459, filed on Dec. 22, 2006.

(51) Int. Cl.
*H02J 7/00* (2006.01)
*H02J 7/04* (2006.01)

(52) U.S. Cl. ......... 320/130; 320/124; 320/125; 320/134

(58) Field of Classification Search ................ 320/122, 320/124, 125, 130, 129, 134, 135, 136, 137, 320/131; 324/430, 426, 425, 429
See application file for complete search history.

(56) References Cited

U.S. PATENT DOCUMENTS

| | | | |
|---|---|---|---|
| 4,937,528 A | 6/1990 | Palanisamy | |
| 6,366,054 B1 * | 4/2002 | Hoenig et al. | 320/132 |
| 6,445,158 B1 | 9/2002 | Bertness | |
| 6,885,167 B2 * | 4/2005 | Palanisamy et al. | 320/104 |
| 7,058,525 B2 | 6/2006 | Bertness et al. | |
| 7,567,086 B2 * | 7/2009 | Salman et al. | 324/426 |
| 2003/0062875 A1 * | 4/2003 | Nakamura et al. | 320/132 |
| 2005/0194976 A1 * | 9/2005 | Yumoto et al. | 324/433 |
| 2006/0001429 A1 * | 1/2006 | Huang | 324/426 |
| 2006/0181245 A1 * | 8/2006 | Mizuno et al. | 320/132 |
| 2006/0232240 A1 * | 10/2006 | Salasoo et al. | 320/119 |
| 2007/0001679 A1 * | 1/2007 | Cho et al. | 324/426 |
| 2007/0279005 A1 * | 12/2007 | Arai | 320/132 |
| 2009/0051364 A1 * | 2/2009 | Ishida et al. | 324/430 |

FOREIGN PATENT DOCUMENTS

DE 19952693 A1 5/2001

OTHER PUBLICATIONS

Verbrugge,M;Adaptive Energy Mgt of Electric & Hybrid Electric Vehicles; J.Electrochemical Soc 152(2) 1-0 (2005).
Cox,M; Automotive "Smart" Battery with State of Health Conductance Testing and Monitoring Technology; SAE 2003-01-0099; 2003; SAE, Warrendale, PA.

* cited by examiner

*Primary Examiner* — Edward Tso
*Assistant Examiner* — Alexis Boateng

(57) ABSTRACT

An electrical energy storage device is monitored by cyclically applying an electrical load thereto and monitoring voltage and current at transient portions of the cyclically applied electrical load.

9 Claims, 4 Drawing Sheets

METHOD AND SYSTEM FOR MONITORING AN ELECTRICAL ENERGY STORAGE DEVICE

CROSS-REFERENCE TO RELATED APPLICATIONS

This application claims priority from U.S. Provisional Application No. 60/871,459, filed Dec. 22, 2006.

TECHNICAL FIELD

This invention pertains generally to electrical energy storage devices.

BACKGROUND

Modern vehicles are highly dependent on proper operation of systems used for electrical power generation, storage and distribution. A reliable supply of electrical energy is needed to operate various systems on-board each vehicle. Predicting the power capability of an electrical energy storage device ('ESD'), such as a battery, and reliably identifying batteries with a potential fault is desirable. Battery state of health ('SOH') comprises an index of remaining useful life of the ESD, expressed as a percentage of total life of the ESD. Known devices available in the market for determining battery SOH require additional hardware and are costly.

SUMMARY

A method for monitoring an electrical energy storage device includes cyclically applying an electrical load to the electrical energy storage device and monitoring electrical voltage and current output from the electrical energy storage device during transient portions of the cyclical application of the electrical load. Internal resistance of the electrical energy storage device is estimated based upon the monitored electrical current and voltage during the transient portions of the cyclical application of the electrical load.

BRIEF DESCRIPTION OF THE DRAWINGS

One or more embodiments will now be described, by way of example, with reference to the accompanying drawings, in which.

DETAILED DESCRIPTION

Figure 1:
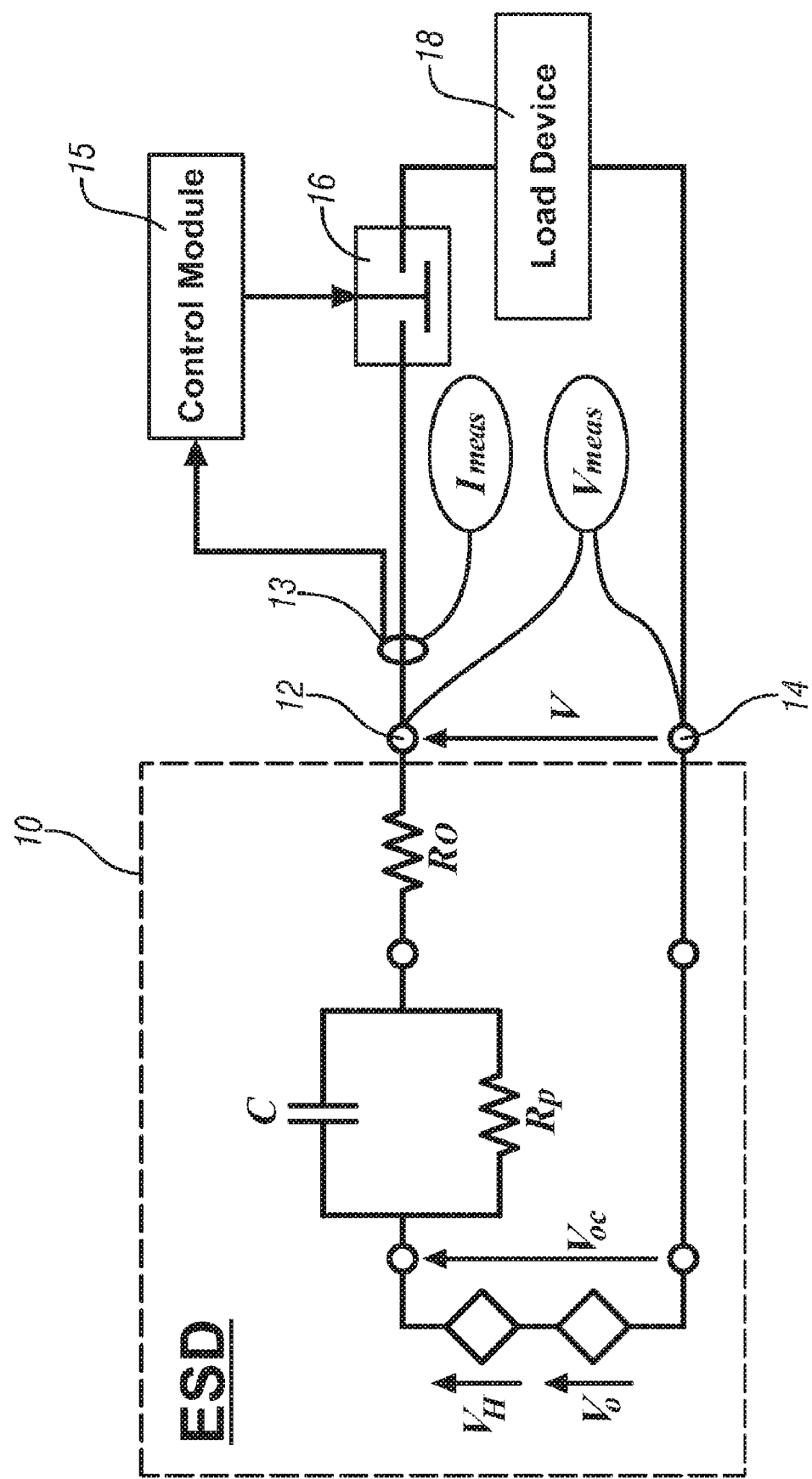
FIG. 1 is a schematic diagram of an exemplary electrical circuit, in accordance with the present disclosure; and, FIGS. 2, 2A, and 2B are diagrams of an algorithmic flowchart, in accordance with the present disclosure.

Referring now to the drawings, wherein the showings are for the purpose of illustrating the embodiments only and not for the purpose of limiting the same, FIG. 1 depicts a schematic diagram comprising a Thevenin equivalent circuit representative of an exemplary electrical energy storage device ('ESD') 10, in accordance with one embodiment. The ESD may include a battery device for application in a vehicle, e.g., a conventional 12 V-dc battery device. Alternatively, the ESD comprises a high-voltage ESD device operative to supply electrical energy to an electromechanical hybrid vehicle system. The equivalent circuit comprises voltage-generating elements $V_O$ and $V_H$, and internal impedance elements comprising high frequency resistance Ro, parallel resistance Rp, and parallel capacitance C. Parameters by which the ESD 10 is evaluated comprise an open-circuit potential (Voc) and an electrical energy output measurable across terminals 12, 14 comprising voltage $V_{meas}$, and electrical current $I_{meas}$.

The ESD 10 is selectively connectable via a wiring harness and a switch 16 to a load device 18, thus creating an electrical circuit. The switch 16 can comprise any one of a number of electrically controllable devices such as, e.g., a solid state of electromechanical relay, operatively controlled by an electronic control module 15. A current sensing device 13 is operative to measure electrical current flow, $I_{meas}$, and is signally connected to the control module. Terminals 12 and 14 are signally connected to the control module, permitting measurement of voltage, $V_{meas}$.

The control module 15 is operative to activate and deactivate a load to the ESD by controlling operation of one or more switches, monitor states of the ESD parameters by monitoring the inputs of electrical current and voltage, and execute algorithms stored therein to determine the state of health of the ESD based upon the monitored states of the ESD. When the control module closes switch 16, the electrical circuit is completed and electric load is applied to the ESD, measurable in terms of the voltage, $V_{meas}$, and the electrical current, $I_{meas}$.

The preferred procedure for monitoring the ESD and determining state of health (SOH) and predicting a remaining useful life is based on an estimation of the high frequency resistance, Ro, of the ESD in situ, preferably during a quiescent period after an elapsed period of time, although the invention is not so limited. A quiescent period is defined, e.g., in an automotive application when ignition is keyed-off. The quiescent period is preferably of sufficient duration to permit stabilization of the ESD, in order to achieve an accurate estimate of the SOC. Alternatively, the load can be applied to the system during system operation so long as the ESD is stable, as determined by operating parameters of the ESD.

The high frequency resistance, Ro, of the ESD is determined by applying an electric load to the ESD, e.g., during the quiescent period, and monitoring the output. The electric load takes the form of a discharge current signal, in the form of a square wave, applied to the ESD. The waveform of the applied discharge current comprises different excitation frequencies, or on-off cycle periods. An appropriate magnitude of the discharge current is about 20 A. The discharge current is achieved by repetitively activating and deactivating the load device 18 that comprises, for example, a rear window defogger when the ESD is a component of a motor vehicle.

The control module 15 is preferably a general-purpose digital computer generally comprising a microprocessor or central processing unit, storage mediums comprising non-volatile memory devices including read only memory (ROM) and electrically programmable read only memory (EPROM), random access memory (RAM), a high speed clock, analog to digital (A/D) and digital to analog (D/A) circuitry, and input/output circuitry and devices (I/O) and appropriate signal conditioning and buffer circuitry. The control module may have a set of control algorithms, comprising resident program instructions and calibrations stored in memory and executable to provide the respective functions of the computer.

Figure 2:
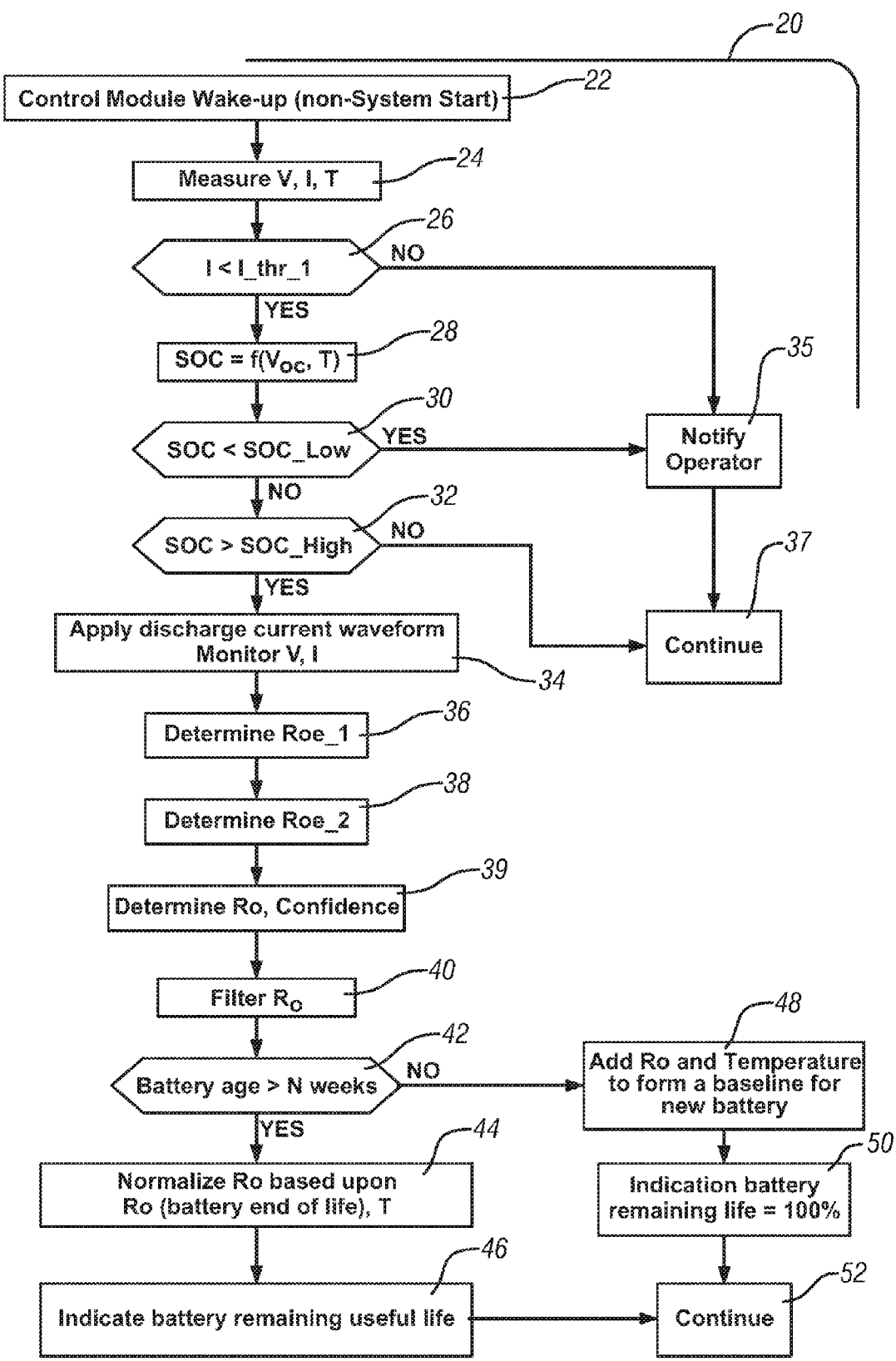
Figure 2A:
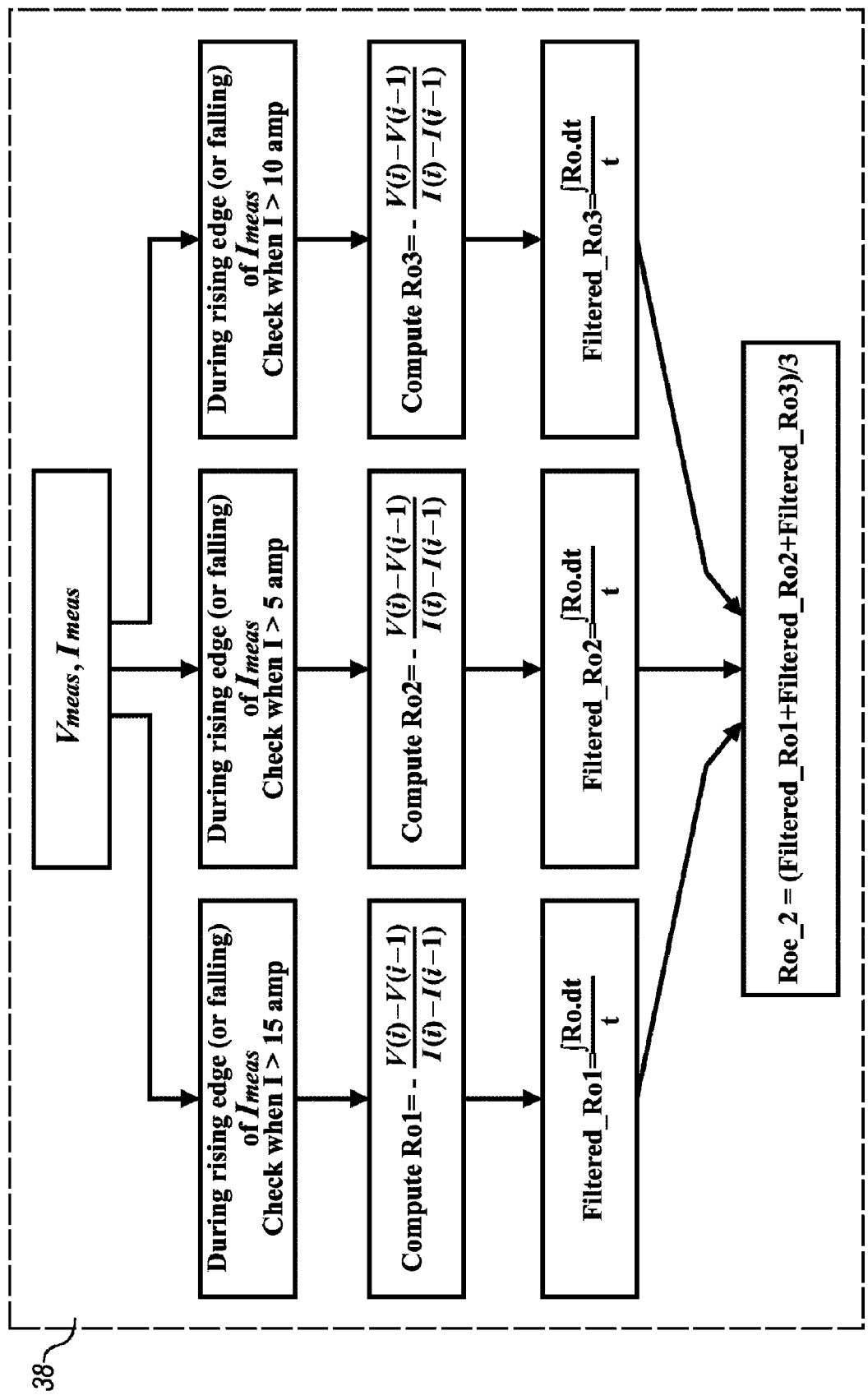
Figure 2B:
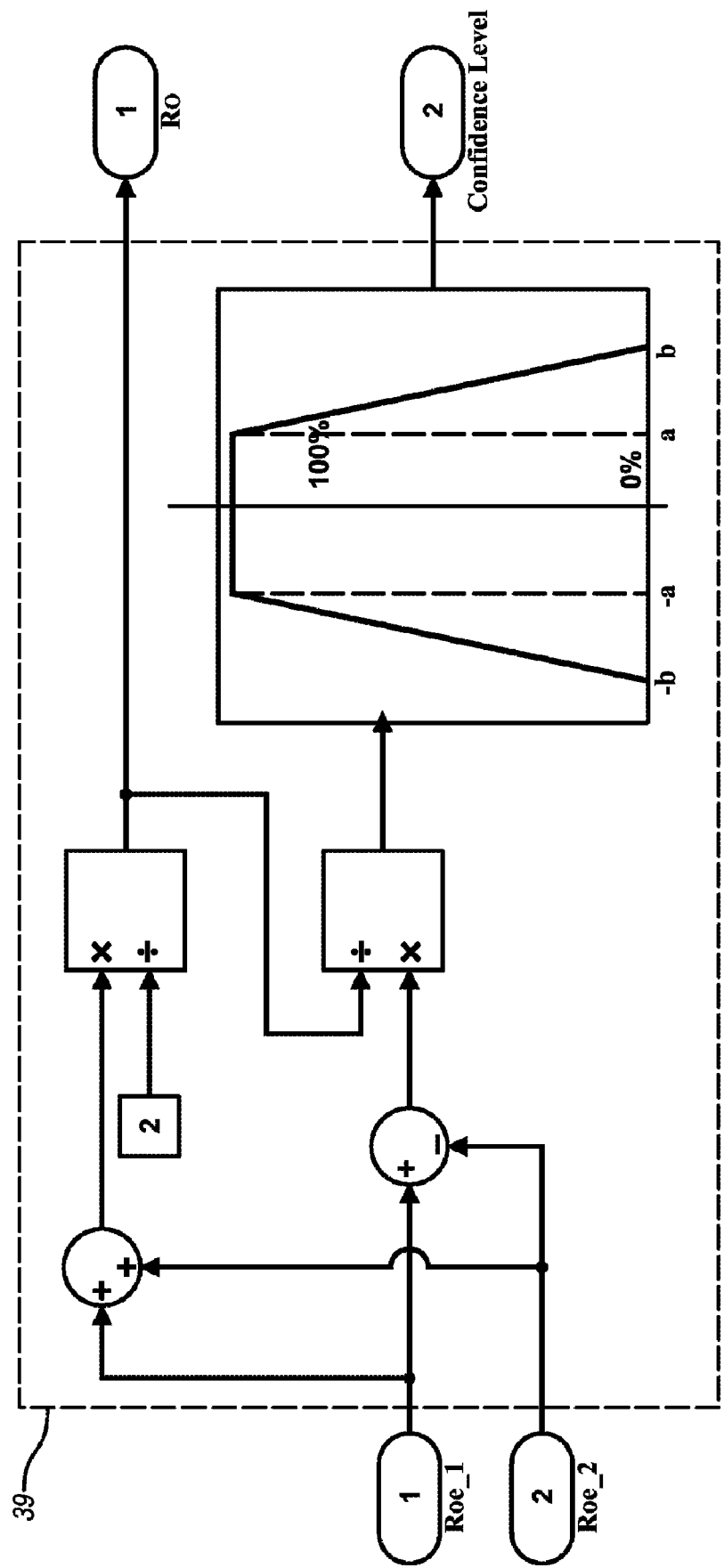

Referring now to FIGS. 2, 2A, and 2B, a flow chart 20 is depicted for an algorithm, preferably executed in the control module, for determining state of health (SOH) of the ESD that is an element of the system constructed in accordance with FIG. 1. The system is preferably in a quiescent period wherein the system is shutoff such that there is minimal or no current flow into or out of the ESD for a predetermined period of time sufficient to stabilize various ESD characteristics. When executed on a vehicle, the quiescent period comprises a key-off period sufficient for internal conditions of the ESD to stabilize, typically a duration in the range of four to six hours. This stabilizing of the ESD allows accurate, repeatable measurement of conditions indicative of the battery state of health, including the the internal operating ESD temperature, T, although it is understood that the ESD temperature does not have to reach ambient temperature for effective operation. During the quiescent period after a period of time of sufficient duration, the control module measures the ESD voltage, $V_{meas}$, and the electrical current, $I_{meas}$, across terminals 12, 14, and the ESD temperature, T, from which it determines the open-circuit ESD voltage ($V_{OC}$) (Step 22). ESD voltage, current, and temperature states are measured using known sensors and signal processing algorithms, as described above (Step 24). The ESD temperature state is determined by a direct measure of ESD temperature using a sensor, or, alternatively, using a battery temperature estimator. An example of a battery temperature estimator comprises using engine coolant temperature and ambient temperature as a measurement substitute or proxy temperature to approximate the battery temperature after the quiescent period in the range described above.

When the ESD current is greater than a first threshold, I_thr_1, (Step 26), the operator is notified (Step 35), typically via a dashboard lamp, and the testing of algorithm 20 is discontinued (Step 37). The first threshold, I_thr_1, comprises a maximum current from the ESD, indicative of an ability to conduct the test.

An ESD state-of-charge is determined based upon the open-circuit ESD voltage and the ESD temperature, T, using any one of several known methods for determining SOC (Step 28). The ESD SOC is estimated from the ESD open circuit voltage, $V_{OC}$, at the ESD temperature, T, typically using pre-calibrated data arranged in tabular format and stored in one of the non-volatile memory devices of the control module. When the ESD SOC is lower than a predetermined threshold state-of-charge (SOC_Low) (Step 30) the operator is notified, as described above with reference to Steps 35, 37. When the ESD SOC is less than a second predetermined threshold state-of-charge (SOC_High) (Step 32), the testing of algorithm 20 is discontinued. The actions undertaken in Steps 22, 24, 26, 28, 30 and 32 occur during the quiescent period prior to the actions of Step 34, and may be independent thereto.

Subsequently, the control module applies the discharge current waveform, by actuating the load device 18 to generate an electrical load and discharge electric current in the embodiment. The electric current and voltage are concurrently monitored (Step 34). The discharge current comprises a current waveform generated by the control module by repetitively switching the load device 18 on and off, e.g., by applying a switching signal to switch 16. The vehicle rear window defogger is an example of an appropriate load. By way of illustration only, in one example the total duration of the switching signal applied to the switch 16 is about 120 seconds. In this illustration, the switching signal from the control module has three parts of different frequencies in the embodiment as described. Each part has a duration of 40 seconds, with 50% duty cycle. The first part has two cycles; each with a period of 20 seconds (10 seconds on and 10 off). The second part has 4 cycles; each with a period of 10 seconds (5 seconds on and 5 off). The third part has 10 cycles; each with a period of 4 seconds (2 seconds on and 2 seconds off). Data, comprising ESD voltage $V_{meas}$ and current $I_{meas}$, are analyzed to determine high frequency resistance of the ESD. Two separate calculations are executed to estimate the high-frequency internal resistance, referred to as Roe_1 and Roe_2 (Steps 36, 38).

The first estimate, Roe_1, is determined using a recursive least squares method to estimate the resistance based upon the monitored data. Such a method is described for example in co-pending and commonly assigned U.S. patent application Ser. No. 11/561,907. The method comprises monitoring state data from the system under the load conditions described with reference to step 34, i.e., $V_{meas}$ and $I_{meas}$, and recursively executing a plurality of equations to converge on an estimated value for the high frequency resistance, Ro, using least-squares methodology.

The second estimate, Roe_2, is determined using a method which executes a filtered analysis of ratios of a change in ESD voltage over a change in current at several points on a rising edge, a falling edge, or both the rising and the falling edges of the output signal measured across terminals 12, 14 (Step 38). Such determinations during transient portions of the cyclically applied electrical load are described in further detail with reference to FIG. 2A.

Referring now to FIG. 2A, the second estimation algorithm calculates ratios of change in voltage to change in current (i.e., $\Delta V_{meas}/\Delta I_{meas}$) at several points measured on rising and falling edges of the output signal. Three points at every rising and falling edge of the output signal are employed in the estimation to obtain an indication of the value of the high frequency resistance. The calculation is triggered when the current passes predetermined current levels of, for example, 5 A, 10 A, and 15 A. Values for resistances Ro1, Ro2, and Ro3 corresponding to the current passing current levels of 5 A, 10 A, and 15 A, are determined at each of the 'i' points (i=1, 2, 3) utilizing Eq. 1:

$$Roi = -\frac{V(i) - V(i-1)}{I(i) - I(i-1)} \quad [1]$$

wherein V(i), and I(i) comprise $V_{meas}$, $I_{meas}$ at the point of trigger, respectively. Voltage and current levels V(i-1), and J(i-1) are the voltage and current at the previously sampled point. The sampling period used is 20 milliseconds (ms). The average value for each of the computed Roi (Filtered_Roi) is computed for each of the triggered current levels as Eq. 2:

$$\text{Filtered\_Roi} = \frac{\int Ro \cdot dt}{t} \quad \text{for } i = 1, 2, 3 \quad [2]$$

wherein 't' is the total elapsed time of the excitation signal.

At the end of the test, an average value for the high frequency resistance using this method is determined using Eq. 3, yielding Roe_2:

$$\text{Roe\_2} = \frac{(\text{Filtered\_Ro1} + \text{Filtered\_Ro2} + \text{Filtered\_Ro3})}{3} \quad [3]$$

The estimated high frequency resistances, Roe_1 and Roe_2, are filtered by averaging all the values over the duration of the test. The high frequency resistance values resulting from the two methods are input to an algorithm to determine an average value of the high frequency resistance and a level of confidence, depicted with reference to FIG. 2B, and described hereinbelow. The level of confidence is calculated based on the normalized residual error between Roe_1 and Roe_2. The two outputs are then used in a subsequent filtering block (Step 40). The weight of the coefficient of the new resistance value on the filtered value is adjusted based on the level of confidence. The ESD high frequency resistance is continually estimated and stored, correlated to the temperature. The normalized distance of the high frequency resistance from its limiting value (i.e., the resistance value at the ESD end of life) at the same temperature is an indicator of the ESD remaining life in percentage level.

The values for Roe_1 and Roe_2 are analyzed to determine the estimate for Ro, and the corresponding confidence level (Step 39). The values for Roe_1 and Roe_2 are expected to be reasonably similar. The values for Roe_1 and Roe_2 are analyzed, as depicted in FIG. 2B, and Ro is calculated and normalized as an average of Roe_1 and Roe_2, as in Eq. 4:

$$Ro = \frac{(Roe\_1 + Roe\_2)}{2} \quad [4]$$

A normalized residue, Delta, is calculated as in Eq. 5:

$$Delta = \frac{(Roe\_1 - Roe\_2)}{Ro} \quad [5]$$

A confidence level is calculated based on the normalized residue, Delta. When this normalized residual value is within a predetermined interval [−a,+a], then the value of the high frequency resistance is the average of the two resistances with a 100% level of confidence. When the normalized residual value is outside the interval [−a,+a] but inside the interval [−b,+b], then the high frequency resistance is the average of the two resistances, with a level of confidence that ranges from 100% to 0%. The level of confidence is 0% when the normalized residual values are outside the interval [−b,+b]. The level of confidence increases linearly from 0 to 100% at the interval of [−b,−a] and decreases linearly from 100% to 0 at the interval of [+a, +b].

Both the high frequency resistance value, Ro, and the level of confidence are input to a filtering block, to reduce the influence of random factors (Step 40). For example, a weighted moving average filter can be used in this application. The weighting of the new resistance value in the filter depends on the level of confidence. For example, when the level of confidence is 0%, then the new value is discarded, and not utilized to determine SOH.

The value of the high frequency resistance may vary between ESD units, and therefore, it is preferable to generate baseline values of Ro based upon temperature and SOC when the ESD comprises a unit newly entered into service. For new batteries (e.g., of an age that is less than a predetermined number of cycles or service time, measured in weeks in the present embodiment), the values of the estimated Ro based upon temperature and SOC are stored in tabular form in a memory device of the control module 15, and a remaining life time indication of 100% is sent to the operator and operation continuing thereafter (Steps 42, 48, 50, 52).

As the ESD ages from continuous cycling, the high frequency resistance increases due to several reasons such as grid corrosion and sulphation. To predict remaining useful life of the ESD, the normalized distance between the estimated value of Ro and the limiting value of Ro (i.e., when the ESD is no longer capable of producing enough power to start the vehicle) at the same temperature and SOC is computed (Step 44). The limiting value of Ro as a function of temperature and SOC can be determined during preproduction development of the system. The remaining useful life of the ESD, i.e., SOH, can be calculated as in Eq. 6:

$$SOH = \frac{(R_{o,limit} - R_o)}{(R_{o,limit} - R_{o,new})} \times 100\% \quad [6]$$

wherein $R_{o,limit}$ is the limiting value of Ro, and $R_{o,new}$ is the Ro value when the ESD is new. For an ESD newly entered into service, the SOH is 100%. As the ESD ages and the resistance increases, the SOH reduces to zero. The ESD SOH is indicated to an operator via a gage, e.g., via an on-board device communicated to a vehicle operator or service technician (Step 46), with operation of the system continuing thereafter (Step 52).

The ESD state of health (SOH) is determined based upon a change in the high frequency resistance, Ro, as compared with a baseline high frequency resistance. A change in SOH over the ESD service life enables the operator to assess aging of the ESD, i.e., to predict a remaining useful life for the ESD. The SOH is determined by estimating internal resistance of the ESD under specific operating conditions. The ESD high-frequency resistance is repeatedly estimated during ongoing operation, and stored in a memory device of the control module along with a correlated ambient temperature. A normalized difference between the parameter for high frequency resistance and a limiting value determined at similar temperature and SOC is indicative of ESD remaining useful life. An exemplary limiting value for SOH comprises a resistance value, $R_{o,limit}$ at which the ESD is no longer capable of producing enough power to start and operate the vehicle.

The disclosure has described certain preferred embodiments and modifications thereto. Further modifications and alterations may occur to others upon reading and understanding the specification. Therefore, it is intended that the disclosure not be limited to the particular embodiment(s) disclosed as the best mode contemplated for carrying out this disclosure, but that the disclosure will include all embodiments falling within the scope of the appended claims.

The invention claimed is:

1. Method for monitoring an electrical energy storage device, comprising:
    cyclically applying an electrical load to the electrical energy storage device and monitoring electrical current and voltage thereof; and
    estimating an internal resistance and a related confidence level of the electrical energy storage device based upon the monitored states of the electrical current and voltage during the cyclically applied electrical load, wherein estimating the internal resistance of the electrical energy storage device comprises estimating first and second internal resistance states of the electrical energy storage device based upon the monitored states of the electrical current and voltage during the cyclically applied electrical load.

2. The method of claim 1, wherein estimating the first internal resistance state comprises recursively executing a least-squares calculation based upon the monitored electrical current and voltage.

3. The method of claim 1, wherein estimating the second internal resistance state comprises determining a ratio between a change in voltage and a change in current during transient portions of the cyclical application of the electrical load.

4. The method of claim 1, wherein estimating the related confidence level of the electrical energy storage device comprises:
   calculating a residual based upon a difference between the first and second estimates for the internal resistance; and
   determining the confidence level based upon the residual.

5. Method for monitoring an electrical energy storage device, comprising:
   cyclically applying an electrical load to the electrical energy storage device and monitoring electrical current and voltage thereof, wherein cyclically applying the electrical load to the electrical energy storage device comprises cyclically activating and deactivating a discrete electrical load device and selectively decreasing a cycle period for activating and deactivating the discrete electrical load device; and
   estimating an internal resistance and a related confidence level of the electrical energy storage device based upon the monitored states of the electrical current and voltage during the cyclically applied electrical load.

6. Method for monitoring an electrical energy storage device, comprising:
   cyclically applying an electrical load to the electrical energy storage device and monitoring electrical current and voltage thereof;
   estimating an internal resistance and a related confidence level of the electrical energy storage device based upon the monitored states of the electrical current and voltage during the cyclically applied electrical load, wherein estimating the internal resistance and related confidence level of the electrical energy storage device comprises
   estimating first and second internal resistance states of the electrical energy storage device based upon the monitored states of the electrical current and voltage during the cyclically applied electrical load; and
   determining a state-of-health of the electrical energy storage device based upon the estimated internal resistance.

7. The method of claim 6, wherein estimating the first internal resistance state comprises recursively executing a least-squares calculation based upon the monitored electrical current and voltage.

8. The method of claim 6, wherein estimating the second internal resistance state comprises determining a ratio between a change in voltage and a change in current during transient portions of the cyclical application of the electrical load.

9. Method for monitoring an electrical energy storage device, comprising:
   cyclically applying an electrical load to the electrical energy storage device;
   monitoring electrical voltage and current output from the electrical energy storage device during transient portions of the cyclical application of the electrical load comprising monitoring electrical voltage at predetermined currents during transient portions of the cyclical application of the electrical load; and
   estimating internal resistance of the electrical energy storage device based upon the monitored electrical current and voltage during the transient portions of the cyclical application of the electrical load.

\* \* \* \* \*